United States Patent

Proctor, Jr. et al.

[11] Patent Number: 5,929,704
[45] Date of Patent: Jul. 27, 1999

[54] CONTROL OF RF ERROR EXTRACTION USING AUTO-CALIBRATING RF CORRELATOR

[75] Inventors: James Arthur Proctor, Jr., Los Gatos; Lance Todd Mucenieks, Boulder Creek, both of Calif.

[73] Assignee: Spectrian, Sunnyvale, Calif.

[21] Appl. No.: 09/026,925

[22] Filed: Feb. 20, 1998

[51] Int. Cl.[6] ........................................ H03F 1/26
[52] U.S. Cl. .......................................... 330/149; 330/151
[58] Field of Search ...................... 330/151, 149, 330/136, 52

[56] References Cited

U.S. PATENT DOCUMENTS

| | | | |
|---|---|---|---|
| 3,922,617 | 11/1975 | Denniston et al. | 330/149 |
| 4,389,618 | 6/1983 | Bauman | 330/149 |
| 4,394,624 | 7/1983 | Bauman | 330/151 |
| 5,455,537 | 10/1995 | Larkin et al. | 330/52 |
| 5,491,454 | 2/1996 | Matz | 330/149 |
| 5,594,385 | 1/1997 | Anvari | 330/149 |
| 5,619,168 | 4/1997 | Myer | 330/149 |

*Primary Examiner*—Robert Pascal
*Assistant Examiner*—Henry Choe
*Attorney, Agent, or Firm*—Charles E. Wands

[57] ABSTRACT

An RF power amplifier has an RF input port to which an RF input signal is coupled, an RF output port from which an amplified RF output signal is derived. An RF carrier cancellation combiner has a first input coupled to the RF input port and a second input coupled to the RF output port. The carrier cancellation combiner produces an RF error signal representative of RF distortion of a signal flow path through the RF amplifier between the RF input port and the RF output port. To reduce a residual carrier signal in the RF error signal, a wideband autocalibrating correlator correlates a reference signal, representative of the RF input signal, with the RF error signal, producing a control signal, which is coupled to a vector modulator to modify the signal flow path through the RF amplifier. A digital signal processor within the correlator measures DC distortion associated with the multiplier components of the correlator and controllably removes DC distortion from the control signal, so that modification of the signal flow path through the RF amplifier by the vector modulator is controlled with a higher precision, providing maximal carrier cancellation.

15 Claims, 1 Drawing Sheet

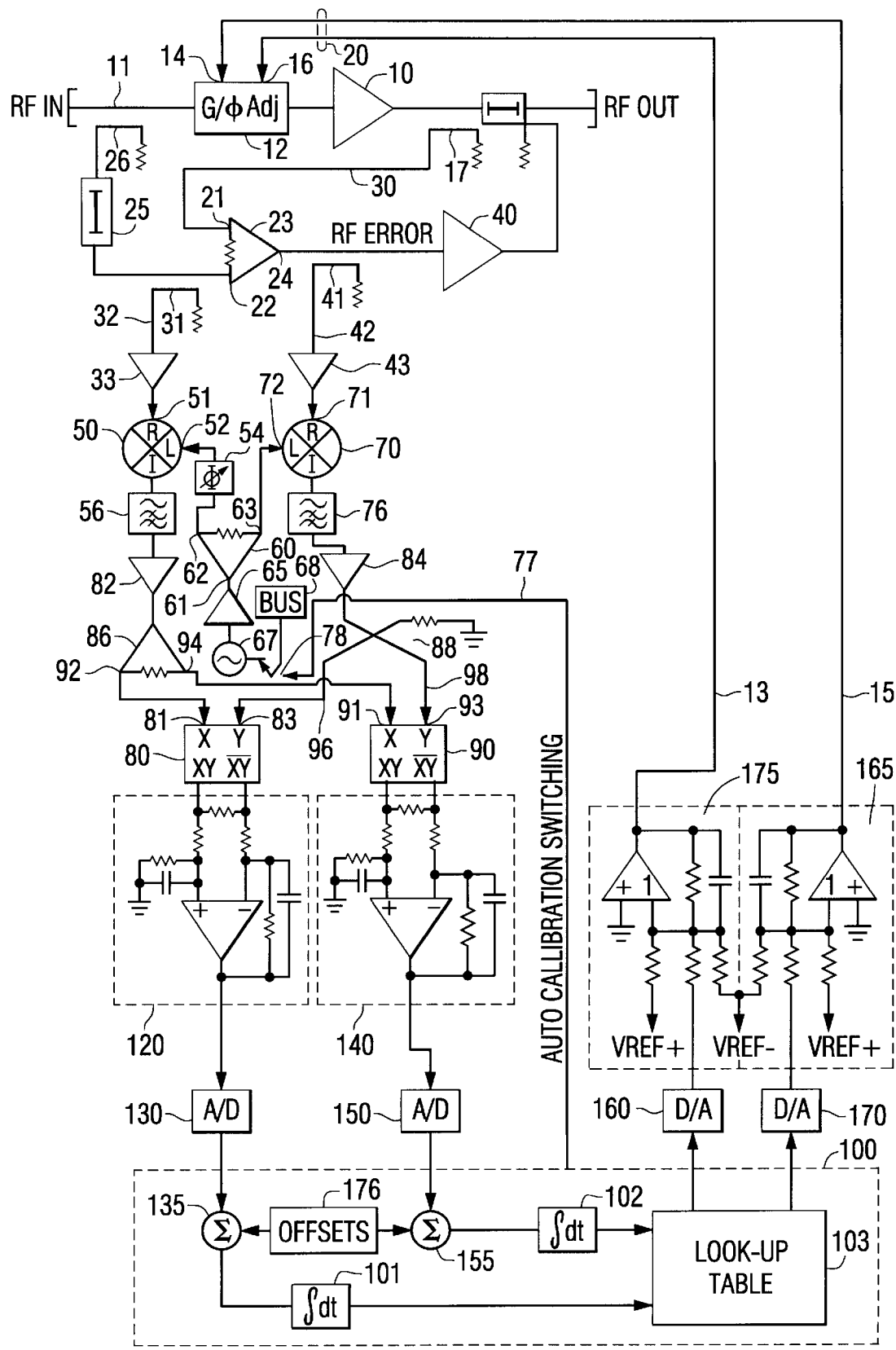

CONTROL OF RF ERROR EXTRACTION USING AUTO-CALIBRATING RF CORRELATOR

FIELD OF THE INVENTION

The present invention relates in general to communication systems, and is particularly directed to the use of an auto-calibrating RF correlator to control an RF distortion extractor, so that the RF carrier is canceled, leaving only the RF error at the output, which can be used to cancel the distortion of a microwave/RF power amplifier. The RF correlator is operative to derive a control signal for a vector modulator used to align the RF signals prior to being canceled; also an unwanted DC voltage associated with the operation of the correlator is measured and removed from the control signal.

BACKGROUND OF THE INVENTION

Communication service providers are subject to very strict bandwidth usage spectrum constraints, such as technically mandated specifications and regulations imposed by the Federal Communications Commission (FCC), which currently requires that sideband spillage, namely the amount of energy spillover outside a licensed band of interest, be sharply attenuated (e.g., on the order of 60 dB). While such specifications are readily achievable for traditional forms of modulation such as single-carrier frequency modulation (FM), they are difficult to achieve using more contemporary, digitally based modulation formats, such as QPSK modulation.

Keeping the sidebands attenuated sufficiently to meet industry or regulatory-based requirements using such modulation techniques mandates the use of very linear signal processing systems and components. Although linear components can be implemented at a reasonable cost at relatively low bandwidths (baseband) used in telephone networks, linearizing such components, especially RF power amplifiers, becomes a very costly exercise.

RF power amplifiers are inherently non-linear devices, and generate unwanted intermodulation products (or 'intermods'), which manifest themselves as spurious signals in the amplified RF output signal, separate and distinct from the RF input signal. This intermodulation distortion is also referred to as spectral regrowth, or spreading of a compact spectrum into spectral regions that do not appear in the RF input signal. The distortion introduced by an RF amplifier causes the phase and amplitude of its amplified output signal to depart from the respective phase and amplitude of the input signal, and may be considered as an incidental (and undesired) AM-to-AM and/or AM-to-PM of the input signal.

One brute force technique for linearizing an RF power amplifier is to build the amplifier as large, high power device and then operate the amplifier at a low power level that is only a small percentage of its rated output power, where the RF amplifier's transfer function is relatively linear. The obvious drawback to this approach is the inefficiency, as well as the high cost and large size. Other prior art attempts to account for RF amplifier degradation have included coupling a 'pre-processing' correction loop in the path of the amplifier's input signal, and/or coupling a 'post-processing', feed-forward correction loop with the amplifier's output signal.

The purpose of a preprocessing correction loop is modify the RF amplifier's input signal path. Ideally the control signal causes the signal path adjustment mechanism to produce a signal control characteristic that has been predetermined to be the inverse of the distortion expected at the output of the RF amplifier. As a consequence, when subjected to the transfer function of the RF amplifier, it will optimally effectively cancel the amplifier's anticipated distortion behavior. The mechanism may be made adaptive by extracting the RF error signal component in the output of the RF amplifier and adjusting the control signal in accordance with the such extracted error behavior of the RF amplifier during real time operation, so as to effectively continuously minimize distortion in the amplifier's output.

A post-processing, feed-forward correction loop, on the other hand, serves to extract the amount of RF error (distortion) present in the RF amplifier's output signal, amplify that extracted distortion signal to the proper level, and then reinject the amplified RF error signal at equal amplitude and opposite phase back into a downstream output path of the RF amplifier, such that (ideally) the amplifier distortion is effectively canceled. To extract this error, the output of the RF amplifier is combined in an RF cancellation combiner with the RF input signal (which is used as a reference), so that, ideally, all carrier components (which give rise to the baseband intermods referenced above) are effectively canceled, leaving only the RF error.

In the past, mechanisms to minimize such RF carrier components have involved the use of analog phase and amplitude adjustment circuits, which attempt to align the phase and amplitude of the two RF signals, using differential amplifier and phase detector circuitry to control phase shifter and attenuator elements installed in one or both RF signal paths. A major shortcoming of this conventional approach is the fact that DC offsets of the detector circuits tend to dominate when the energy in the RF signals becomes relatively low, causing the carriers to become misaligned. While this misalignment is not of practical significance for low energy signals, it becomes a major problem when a large RF pulse is received, and the loop does not have sufficient time to respond. When misaligned high energy content RF carriers are applied to the combiner, unwanted RF carrier energy will contribute substantially to the content of the RF error signal, and introduce distortion in the feed-forward loop by overdriving the error amplifier. Also, if the amount of RF carrier energy resulting from misalignment of the two signals is large, the resulting RF error signal can actually damage the error amplifier feeding the downstream feed-forward injection loop.

SUMMARY OF THE INVENTION

In accordance with the present invention, this problem is effectively eliminated by an RF signal-canceling, auto-calibrated correlator that correlates the RF reference and output signal of the RF cancellation combiner and produces phase and gain control signals for a vector modulator installed in the path of the non-linear RF power amplifier. The vector modulator has respective gain and phase control ports, to which correlator-based amplitude and phase control signals generated by a digital signal processor are supplied. These control signals cause the vector modulator to maximize cancellation of RF carrier signals at the output of the RF carrier cancellation combiner, so as to leave only RF error.

More particularly, in order to extract the RF error signal, the RF amplifier output is coupled to a carrier cancellation combiner, which is also coupled to receive a delayed version of the RF input signal as a reference signal. The output of the carrier cancellation combiner is coupled to an RF error signal path to a downstream correlator. The reference signal is coupled to a reference signal path of the correlator. The reference and RF error signals are downconverted to an IF frequency range that falls within the bandwidth of a pair of four-quadrant multipliers.

The downconverted outputs of the mixers are filtered in bandpass filters and coupled through respective amplifiers to in-phase and quadrature-phase signal splitters. The in-phase signal splitter has in-phase outputs, which are coupled to first inputs of respective amplitude and phase multipliers. The quadrature-phase signal splitter has a first in-phase output coupled to a second input of the amplitude multiplier and a second quadrature-phase output coupled to a second input of the phase multiplier.

The products of the amplitude and phase multipliers are low pass-filtered, digitized and coupled to a digital signal processor, where they are integrated into respective amplitude and phase correlation values. These respective amplitude and phase correlation values are then mapped via a look-up table into amplitude and phase correction codes, which are converted into analog amplitude and phase signals, for controlling the operation of the vector modulator.

In addition to performing integration of each of the amplitude and phase signal paths from the amplitude and phase multipliers, the correlator's digital signal processor controllably measures and then removes any DC offsets that are introduced by the analog signal processing components of respective upstream multiplier circuitry paths. To measure DC offset, the processor is programmed to periodically supply a control signal, which decouples (turns off) the supply voltage to the local oscillator driving the IF downconversion circuit, and thereby eliminates IF signals from the reference and RF error integration signal paths. Prior to removing the supply voltage for the local oscillator, the processor stores the most recent integration codes, which are then used to freeze the amplitude and phase control signals to the vector modulator during the autocalibration mode.

During autocalibration (DC offset measurement) mode, the processor measures any DC offset voltages that are introduced by the analog components of the correlation circuitry. Since these DC offset voltages are measured independently of the RF signals being amplified by the RF amplifier, they represent only unwanted error contributions of the correlation processing components, which must be removed, in order that they will not contribute to amplitude and phase control inputs to the vector modulator. For this purpose, the digital signal processor stores the measured DC offset voltage codes, which are then subtracted from the amplitude and phase product signals during the RF signal processing mode of operation.

BRIEF DESCRIPTION OF THE DRAWINGS

The FIG. 1 diagrammatically illustrates an embodiment of the wideband, auto-calibrating RF correlator in accordance with the invention, as installed in an RF power amplifier vector modulator loop and coupled with an RF error extraction loop for feedforward error correction.

DETAILED DESCRIPTION

Before describing in detail the new and improved wideband, auto-calibrating correlator that may be employed in an RF power amplifier vector modulator control loop in accordance with the present invention, it should be observed that the invention resides primarily in what is effectively a prescribed arrangement of conventional communication circuits and associated digital signal processing components and attendant supervisory control circuitry, that controls the operations of such circuits and components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

The FIG. 1 diagrammatically illustrates a non-linear RF power amplifier 10 employing a vector modulator control loop 20 and an RF error extraction loop 30 for a downstream feedforward error correction mechanism including a reinjection error amplifier 40, which employs the wideband, auto-calibrating RF correlator of the present invention. As shown therein the RF amplifier 10 has an input port 11, to which an RF input signal to be amplified is applied. RF input port 11 is coupled to a vector modulator 12, the output of which is coupled to the non-linear RF amplifier 10. Vector modulator has gain and phase control input ports 14 and 16, to which amplitude and phase control signals conveyed over links 13 and 15, respectively, generated by a digital signal processor 100, are supplied. Under the control of signals applied to ports 14 and 16, vector modulator 12 modifies the RF input signal in a manner that effectively maximizes cancellation of RF carriers by an RF carrier cancellation combiner 23, and thereby leaving only RF error.

In order to extract the RF error signal component in the output of the RF amplifier 10 for adjusting the amplitude and phase control signals on links 13 and 15, and for the downstream feed-forward correction mechanism 40, the output of the RF amplifier 10 is coupled via a directional coupler 17 to a first input 21 of an RF carrier cancellation combiner 23, a second input 22 of which is coupled via a delay line 25 and a directional coupler 26 to the RF input port 11. As a non-limiting example, RF carrier cancellation combiner 23 may be implemented as a Wilkinson splitter/combiner. The output 24 of the (Wilkinson) carrier cancellation combiner 23 provides an RF error signal as the equal amplitude, out-of-phase summation of an RF reference signal, corresponding to a delayed version of the RF input signal at input port 11 (using delay circuit 25 for signal alignment), and the extracted amplified RF output signal via directional coupler 17, containing whatever uncorrected RF error has been introduced by the non-linear RF amplifier 10.

The RF reference signal component at the input 22 of the Wilkinson carrier cancellation combiner 23 is extracted via a directional coupler 31 and is coupled thereby to a first, reference signal path 32. The RF error signal component at the output 24 of the Wilkinson carrier cancellation combiner 23 is extracted via a directional coupler 41 and coupled thereby to a second, error signal path 42. The error signal in path 42 is amplified by amplifier 43 and coupled to a first input port 71 of mixer 70. The reference signal is amplified by an amplifier 33 and coupled to a first input port 51 of a mixer 50. A local oscillator is coupled to the second input port 52 of mixer 50 via a phase adjustment circuit 54 from a first output port 62 of a Wilkinson splitter 60. The local oscillator is also coupled via second output port 63 of splitter 60 to a second input port 72 of mixer 70.

The phase adjustment circuit 54 is used to ensure that inputs 52, 72 to respective mixers 50 and 70 are aligned, so as to provide amplitude and phase detection in multipliers 80 and 90. Wilkinson splitter 60 has its input port 61 coupled via an amplifier 65 to the output of a voltage controlled oscillator (VCO) 67, the supply voltage for which is provided via a switch 78 from a bias voltage supply 68. As will be described, during autocalibration (DC offset measurement) mode, switch 78 is operated so as to effectively decouple the RF signals in paths 32 and 42 from downstream correlation circuitry, so that parasitic DC offsets introduced by the correlation circuitry may be measured independently of the DC offsets generated by the RF signals being processed, so as not to introduce inaccuracies in the measurement of RF correlation between paths 32 and 42.

Mixers 50 and 70 serve to downconvert the RF signals in paths 32 and 42 to a frequency range (IF bandwidth) that falls within the bandwidth (e.g., on the order of 450 MHz, as a non-limiting example) of a pair of four-quadrant multipliers 80 and 90 of downstream correlator circuitry. (If the multipliers are capable of operation at the bandwidth of the carrier of the RF input signal, downconversion circuitry is unnecessary.) The outputs of the mixers 50 and 70 are filtered in bandpass filters 56 and 76, respectively, and coupled through respective IF amplifiers 82 and 84 to in-phase and quadrature-phase signal splitters 86 and 88.

In-phase signal splitter 86 may comprise a Wilkinson splitter having first and second in-phase outputs 92 and 94, which are coupled to first inputs 81 and 91 of respective multipliers 80 and 90. Quadrature-phase signal splitter 88 may comprise a quadrature hybrid having a first in-phase input 96 coupled between a zero degree port of the coupler and a second input 83 of multiplier 80. A second quadrature-phase input 98 is coupled to a second input 93 of multiplier 90. With these in-phase connections at 81 and 83, multiplier 80 effectively functions as an amplitude detector, whereas with the quadrature connections at 91 and 93, multiplier 90 functions as a phase detector.

The product output of amplitude multiplier 80 is filtered in a low pass filter 120 and then digitized via an analog-to-digital converter (ADC) 130. Similarly, the product output of phase multiplier 90 is filtered in a low pass filter 140 and then digitized via an ADC 150. The digital outputs of ADCs 130 and 150 are supplied to the digital signal processor (DSP) 100, wherein they are integrated into respective amplitude and phase correlation values, as diagrammatically illustrated by respective integration signal processing routines 101 and 102 executed within DSP 100.

These respective amplitude and phase integration values are then mapped by means of a look-up table 103 into amplitude and phase correction codes. Digital-to-analog converters (DACs) 160 and 170 convert these codes into amplitude and phase control signals, which are filtered in low pass filters 165 and 175, and coupled over lines 13 and 15 to respective amplitude and phase control ports 14 and 16 of vector modulator 12, for controlling its operation, as described above.

In addition to performing the integration of the phase and amplitude detector outputs produced from multipliers 80 and 90, the DSP 100 is operative to controllably measure and then remove any DC offsets that are introduced by the analog signal processing components of respective upstream multiplier circuitry paths 32 and 42. For this purpose, the DSP 100 is programmed to periodically supply a control signal over switch control link 77, which decouples (turns off) the supply voltage to VCO 67, and thus decouples the IF signals from paths 32 and 42. Prior to supplying this control signal over switch control link 77 to remove the downconversion supply voltage for VCO 67, the DSP 100 stores the most recent integration codes, so that they may continue to be supplied to look-up table 103 for providing amplitude and phase control signals for vector modulator 12, during autocalibration.

In the autocalibration (DC offset measurement) mode of operation, what is measured by DSP 100 at the outputs of ADCs 130 and 150 are any parasitic DC offset voltages introduced by non-ideal characteristics of analog components of the correlation circuitry. These DC offset voltages do not correspond to a correlation between the RF signals in paths 32 and 42, they represent only unwanted error contributions of the correlation processing components. They must be removed, in order that such components will not erroneously influence the RF alignment output of carriers at the cancellation combiner 23. For this purpose, the DSP 100 stores the measured DC offset voltage codes in respective buffers, so that they be subtracted from the amplitude and phase product signals as digitized by ADCs 130 and 150 during the RF signal processing mode of operation (as diagrammatically represented by subtraction operators 135 and 155 to which the DC voltage offset codes 176 are supplied.

As will be appreciated from the foregoing description, the problem of unwanted DC offsets in IF error detection/correction components used in the error extraction circuitry, which results in residual carrier power in the RF error signal, are effectively obviated in accordance with the present invention, by means of an offset-canceling, auto-calibrated correlator. The correlator is coupled to receive the RF reference and error signals of an RF carrier cancellation combiner and produces DC offset-compensated phase and gain control signals for a vector modulator installed in the RF power amplifier's input signal path.

It should be noted by that the RF signal-canceling, auto-calibrated correlator of the invention may be employed in any application where a reference signal is to be removed from a signal composed of that reference signal plus an additional signal (typically referred to as an error signal). A non-limiting example may involve deriving an RF error signal for use in polar envelope correction, such as described in co-pending U.S. patent application Ser. No. 08/594,089, filed Jan. 30, 1997, entitled "Polar Envelope Correction Mechanism for Enhancing Linearity of RF/Microwave Power Amplifier," by J. Eisenberg et al, now U.S. Pat. No. 5,742,201, assigned to the assignee of the present application and the disclosure of which is incorporated herein. Another non-limiting example involves an adaptive predistortion scheme, such as a table-based complex gain predistorter or work function-based predistorter, which may be of the type described in co-pending U.S. patent application Ser. No. 08/626,239, filed Mar. 29, 1996, entitled "Adaptive Compensation of RF Amplifier Distortion by Injecting Predistortion Signal Derived from Respectively Different Functions of Input Signal Amplitude," by D. Belcher et al, assigned to the assignee of the present application and the disclosure of which is incorporated herein. These schemes may benefit from the present invention, in the course of adapting the parameters of the modulation input to the RF amplifier, so as to minimize the error measured at the output of the error extractor/digital correlator.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. For use with an RF power amplifier having an RF carrier input port to which an RF input signal is coupled, an RF output port from which an amplified RF output signal is derived, and an RF carrier cancellation combiner having a first input coupled to said RF input port and a second input coupled to said RF output port, and being operative to produce an RF error signal through said RF amplifier between said RF input port and said RF output port, an arrangement for reducing a DC component of a correlation signal used for control of RF signal alignment to effect RF carrier cancellation by said RF carrier cancellation combiner comprising:

an RF carrier modification circuit coupled between said RF input port and an input to said RF power amplifier, and being operative to modify said RF carrier input signal to said RF power amplifier;

a signal combiner which combines said RF carrier input signal with said RF error signal, producing a control signal, which is used to control said RF carrier modification circuit and thereby modify said signal flow path through said RF power amplifier so as to align RF signals prior to cancellation; and a signal processor which measures DC distortion associated with said signal combiner, and controllably removes said DC distortion from said control signal, so that control of said RF carrier modification circuit and thereby modification of said signal flow path through said RF amplifier is performed exclusive of said DC distortion associated with said signal combiner.

2. An arrangement according to claim 1, wherein said signal processor is operative to measure said DC distortion by controllably decoupling said RF carrier input signal and said RF error signal from said signal combiner.

3. An arrangement according to claim 1, wherein said signal combiner comprises a correlator circuit, which correlates said RF carrier input signal with said RF error signal to produce said control signal, and wherein said signal processor is operative to measure said DC distortion associated with the operation of said correlator circuit and to controllably remove said DC distortion from said control signal.

4. An arrangement according to claim 3, wherein said correlator circuit comprises a wideband multiplier having an operational bandwidth that contains the variation bandwidth of said RF carrier input signal.

5. An arrangement according to claim 3, wherein said RF carrier modification circuit comprises a vector modulator coupled in an RF carrier signal flow path between said RF carrier input port and said RF power amplifier, and being responsive to said control signal to modify said RF input signal so as to align RF signals prior to cancellation thereof.

6. An arrangement according to claim 5, wherein said correlator circuit comprises wideband multiplier circuitry having an operational bandwidth that contains the variation bandwidth of said RF carried input signal.

7. An arrangement according to claim 6, wherein said wideband multiplier circuitry is operative to generate a first product signal representative of the product of in-phase versions of said RF carrier input signal and said RF error signal, and a second product signal representative of the product of quadrature versions of said RF carrier input signal and said RF error signal, and an integrator which is operative to integrate said first and second product signals, producing respective gain and phase adjustment signals for controlling the operation of said vector modulator, and wherein said signal processor comprises a DC offset compensator coupled with said wideband multiplier circuitry and being operative to remove DC offsets introduced into said first and second product signals by said wideband multiplier circuitry.

8. An arrangement according to claim 3, wherein said signal processor is operative to measure said DC distortion associated with said correlator circuit, while controllably decoupling said RF error signal and said RF carrier input signal from said correlator circuit, and also applying a previous value of said control signal to said RF carrier modification circuit.

9. An arrangement according to claim 1, further including a feedforward error correction circuit which is coupled in an RF signal flow path downstream of said RF amplifier and is operative to cancel distortion of amplified RF output signal by an equal said amplitude, anti-phase RF error signal.

10. For use with an RF power amplifier having an RF input port to which an RF carrier input signal is coupled, an RF output port from which an amplified RF output signal is derived, a vector modulator coupled between said RF input port and an input to said RF power amplifier, and an RF carrier cancellation combiner having a first input coupled to said RF input port and a second input coupled to said RF output port, and being operative to produce an RF error signal representative of RF distortion of a signal flow path through said RF amplifier between said RF input port and said RF output port, and wherein said RF carrier input signal is combined in a signal processing circuit with said RF error signal producing a control signal which adjusts the operation of said vector modulator, so as to minimize said RF carrier input signal in said RF error signal produced by said RF carrier cancellation combiner, a method of minimizing a DC component of said RF error signal comprising the steps of:

(a) measuring DC distortion associated with said signal processing circuit; and (b) removing said DC distortion from said control signal, so that adjustment of said vector modulator is carried out exclusive of error associated with said signal processing circuit.

11. A method according to claim 10, wherein said signal processing circuit comprises a correlator circuit which correlates said RF carrier input signal with said RF error signal to produce said control signal, and wherein step (a) comprises measuring DC distortion associated with the operation of said correlator circuit.

12. A method according to claim 11, wherein step (a) comprises measuring said DC distortion associated with said correlator circuit, while controllably decoupling said RF carrier input signal and said RF error signal from said correlator circuit, and also applying a previous value of said control signal to said vector modulator.

13. A method according to claim 12, wherein said correlator circuit comprises a wideband multiplier having an operational bandwidth that contains the variation bandwidth of said RF carrier input signal.

14. A method according to claim 13, wherein said wideband multiplier circuitry is operative to generate a first product signal representative of the product of in-phase versions of said RF carrier input signal and said RF error signal, and a second product signal representative of the product of quadrature versions of said RF carrier input signal and said RF error signal, and an integrator which is operative to integrate said first and second product signals, producing respective gain and phase adjustment signals for controlling the operation of said vector modulator, and wherein said signal processing circuit comprises a DC voltage offset compensator coupled with said wideband multiplier and is operative to remove DC voltage offsets introduced into said first and second product signals by said wideband multiplier.

15. A method according to claim 11, further including a feedforward error correction circuit which is coupled in an RF signal flow path downstream of said RF amplifier and is operative to cancel distortion of said amplified RF output signal by an equal amplitude, anti-phase RF error signal.

* * * * *